(12) United States Patent
Robbins

(10) Patent No.: US 6,936,546 B2
(45) Date of Patent: Aug. 30, 2005

(54) APPARATUS FOR SHAPING THIN FILMS IN THE NEAR-EDGE REGIONS OF IN-PROCESS SEMICONDUCTOR SUBSTRATES

(75) Inventor: Michael D. Robbins, Danbury, CT (US)

(73) Assignee: Accretech USA, Inc., Oakland, NJ (US)

(*) Notice: Subject to any disclaimer, the term of this patent is extended or adjusted under 35 U.S.C. 154(b) by 0 days.

(21) Appl. No.: 10/401,074

(22) Filed: Mar. 27, 2003

(65) Prior Publication Data

US 2003/0203650 A1 Oct. 30, 2003

Related U.S. Application Data

(60) Provisional application No. 60/376,154, filed on Apr. 26, 2002.

(51) Int. Cl.[7] .............................................. H01L 21/302
(52) U.S. Cl. .................... 438/707; 438/710; 438/730; 204/298.07; 204/298.15; 204/298.31
(58) Field of Search ................................ 438/707, 710, 438/730; 156/345; 216/67, 70; 204/298.07, 298.15, 298.31

(56) References Cited

U.S. PATENT DOCUMENTS

| | | |
|---|---|---|
| 3,762,941 A | 10/1973 | Hou |
| 4,012,307 A | 3/1977 | Phillips |
| 4,277,304 A | 7/1981 | Horiike et al. |
| 4,430,547 A | 2/1984 | Yoneda et al. |
| 4,510,176 A | 4/1985 | Cuthbert et al. |
| 4,555,303 A | 11/1985 | Legge et al. |
| 4,705,593 A | 11/1987 | Haigh et al. |
| 4,708,766 A | 11/1987 | Hynecek |
| 4,749,440 A | 6/1988 | Blackwood et al. |
| 4,857,382 A | 8/1989 | Liu et al. |
| 4,872,938 A | 10/1989 | Davis et al. |

(Continued)

OTHER PUBLICATIONS

ISA/US International Search Report dated Sep. 23, 2003 regarding International Application No. PCT/US03/12615.

*Primary Examiner*—Hsien-Ming Lee
(74) *Attorney, Agent, or Firm*—Harness, Dickey & Pierce, PLC

(57) ABSTRACT

An apparatus for shaping and encapsulating near edge regions of a semiconductor wafer is described. A housing of the apparatus has a slot for receiving an edge of a wafer affixed on a rotatable chuck. At least one plasma source connected to the housing generates a flow of reactive gas towards the edge of the wafer. A channel in the housing directs a flow of diluent/quenching gas onto the wafer in close proximity to an exhaust channel for exhausting of the diluent/quenching gas and the reactive gas away from the wafer. The apparatus may also provide a plurality of plasma sources, for example, plasma sources for selectively etching of a polymer on the wafer, etching of silcon dioxide on the wafer and depositing an encapsulating silicon dioxide layer on the wafer.

14 Claims, 8 Drawing Sheets

U.S. PATENT DOCUMENTS

| | | | |
|---|---|---|---|
| 4,875,989 | A | 10/1989 | Davis et al. |
| 4,921,157 | A | 5/1990 | Dishon et al. |
| 5,000,819 | A | 3/1991 | Pedder et al. |
| 5,045,166 | A | 9/1991 | Bobbio |
| 5,087,341 | A | 2/1992 | Tsukada et al. |
| 5,110,407 | A | 5/1992 | Ono et al. |
| 5,120,568 | A | 6/1992 | Schuurmans et al. |
| 5,126,164 | A | 6/1992 | Okazaki et al. |
| 5,147,520 | A | 9/1992 | Bobbio |
| 5,178,682 | A | 1/1993 | Tsukamoto et al. |
| 5,201,995 | A | 4/1993 | Reisman et al. |
| 5,225,659 | A | 7/1993 | Kusano et al. |
| 5,240,559 | A | 8/1993 | Ishida |
| 5,290,378 | A | 3/1994 | Kusano et al. |
| 5,290,382 | A | 3/1994 | Zarowin et al. |
| 5,292,370 | A | 3/1994 | Tsai et al. |
| 5,308,447 | A | 5/1994 | Lewis et al. |
| 5,316,739 | A | 5/1994 | Yoshikawa et al. |
| 5,340,618 | A | 8/1994 | Tanisaki et al. |
| 5,368,685 | A | 11/1994 | Kumihashi et al. |
| 5,372,674 | A | 12/1994 | Steinberg |
| 5,384,167 | A | 1/1995 | Nishiwaki et al. |
| 5,391,855 | A | 2/1995 | Tanisaki |
| 5,399,830 | A | 3/1995 | Maruyama |
| 5,407,121 | A | 4/1995 | Koopman et al. |
| 5,449,432 | A | 9/1995 | Hanawa |
| 5,458,734 | A | 10/1995 | Tsukamoto |
| 5,474,640 | A | 12/1995 | Ye et al. |
| 5,474,642 | A | 12/1995 | Zorina et al. |
| 5,499,754 | A | 3/1996 | Bobbio et al. |
| 5,549,780 | A | 8/1996 | Koinuma et al. |
| 5,597,438 | A | 1/1997 | Grewal et al. |
| 5,688,555 | A | 11/1997 | Teng |
| 5,693,241 | A | 12/1997 | Banks et al. |
| 5,722,581 | A | 3/1998 | Sindzingre et al. |
| 5,945,351 | A | 8/1999 | Mathuni |
| 5,961,772 | A | 10/1999 | Selwyn |
| 6,004,631 | A | 12/1999 | Mori |
| 6,020,639 | A | 2/2000 | Ulrich et al. |
| 6,022,417 | A | 2/2000 | Sumnitsch |
| 6,027,760 | A * | 2/2000 | Gurer et al. .................... 427/8 |
| 6,309,981 | B1 | 10/2001 | Mayer et al. |
| 6,406,589 | B1 | 6/2002 | Yanagisawa |
| 6,531,069 | B1 * | 3/2003 | Srivastava et al. ............ 216/67 |

* cited by examiner

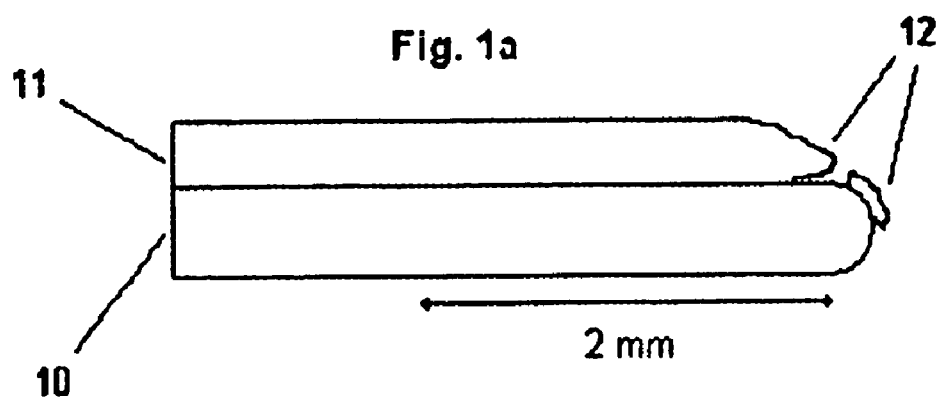
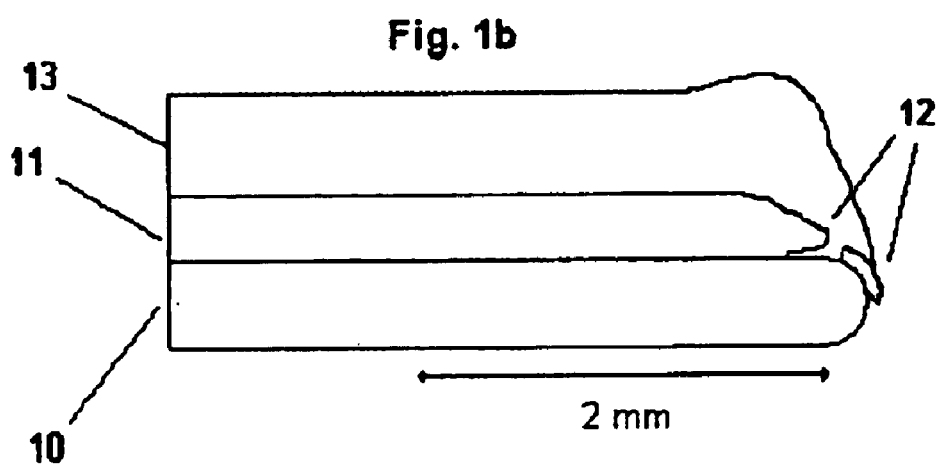
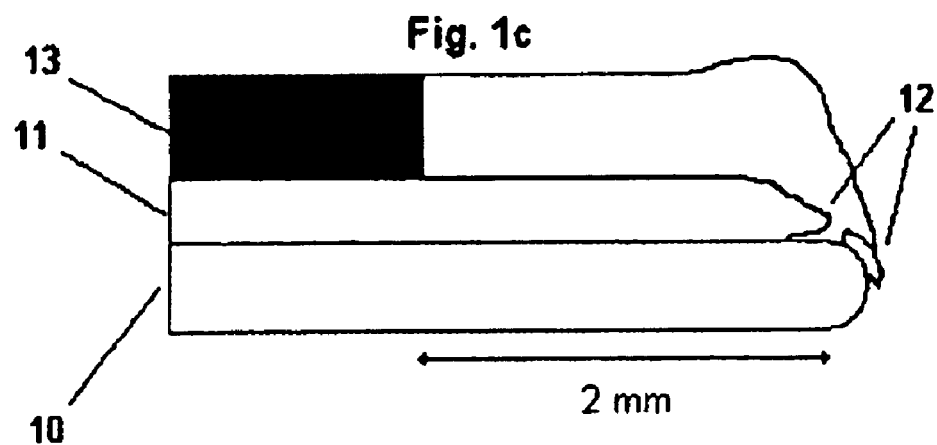

APPARATUS FOR SHAPING THIN FILMS IN THE NEAR-EDGE REGIONS OF IN-PROCESS SEMICONDUCTOR SUBSTRATES

This application claims the benefit of Provisional Application 60/376,154, filed Apr. 26, 2002.

This invention relates to a method and apparatus for shaping thin films on in-process semiconductor substrates. More particularly, this invention relates to a method and apparatus for shaping thin films in the near-edge regions of in-process semiconductor substrates employing plasma techniques.

Future trends in IC manufacturing processes require manufacturing engineers to become more attentive to the root causes of contamination. An emerging awareness, within the IC manufacturing engineering community, has recognized the substrate's edge exclusion area and edge surfaces as source locations of contamination. Contamination problems originating in these edge areas are the result of poorly adhering films that partially delaminate and break loose from the surface. These loose film fragments, or flakes, if they migrate towards the center of the wafer where active devices are being constructed, can become killer defects.

There is also a problem with existing remedies (Edge Bead Removal or EBR) for the flaking films. Traditional EBR methods are time consuming and expensive. Additionally, these EBR processes produce large volumes of hazardous waste. Finally, EBR processes yield topography near the edge that is not readily cleanable and traps particles.

Accordingly, it is an object of the invention to enable the use of relatively simple techniques for removing flaking films during the processing of a wafer.

It is another object of the invention to control the film shape on a processed wafer.

It is another object of the invention to provide an economical technique for shaping the edge of a wafer during processing.

Briefly, the invention provides an apparatus and method for shaping a thin film on a wafer.

The apparatus of the invention employs a rotatable chuck for holding a wafer, a housing having a slot for receiving an edge of a wafer on the chuck, at least one plasma source mounted on the housing for generating a flow of reactive gas and a channel in the housing communicating with the plasma source to direct the flow of reactive gas toward the edge of the wafer in the slot of the housing.

In addition, an exhaust plenum is disposed within the housing for receiving the reactive gas and an exhaust line communicates with and extends from the exhaust plenum for expelling reactive gas from the plenum.

Still further, there is at least one additional channel in the housing radially within the first channel for directing a flow of diluent/quenching gas onto the wafer; and at least one exhaust channel in the housing between this additional channel and the first channel for exhausting the diluent/quenching gas and reactive gas therefrom.

Generally, the housing is of semi-circular shape to receive a major portion of the wafer on the chuck in the slot but may be of any other suitable shape.

The apparatus may also be constructed with multiple sets of the inlet channels and exhaust channel and a plurality of plasma sources, for example, three plasma sources spaced circumferentially of the housing, for selectively etching of a polymer on a wafer, etching of silicon dioxide on a wafer and depositing an encapsulating silicon dioxide layer on a wafer.

The method of the invention comprises the steps of mounting a wafer having a thin film on a rotatable chuck; directing a flow of diluent/quenching gas onto the wafer in a radially outward direction; exhausting the flow of diluent/quenching gas from the wafer downstream of the flow of diluent/quenching gas; directing a flow of reactive gases towards the wafer radially outward of the diluent/quenching gas to react with the wafer; and rotating the wafer relative to the flow of reactive gas to remove film fragments from the edge of the wafer or to deposit material on the wafer.

During rotation, the wafer is moved in a rectilinear direction relative to the flow of reactive gas to allow removal of material from the thin film normally on the wafer while shaping the thin film to a predetermined shape. Thereafter, a second flow of reactive gases can be directed towards the wafer radially outward of the diluent/quenching gas to react with the wafer to deposit material thereon while the wafer is rotated to deposit a thin protective film of the material on the shaped thin film on the wafer.

The processing capability enabled by the method and apparatus described herein addresses both removal of the flaking films and control of the film shape that remains after processing. The film shaping capability allows for the use of conventional cleaning processes without particle trapping. Further, the process can also encapsulate the freshly processed surface with a thin film that prevents future flaking.

In accordance with the invention, an in-process semiconductor substrate (wafer) is held in place on a platen (e.g., using vacuum). The platen is sufficiently smaller, in diameter, than the wafer, allowing access to all of the edge surfaces of the wafer. The platen is attached to a spindle, which, in-turn, is connected to a rotational electro-mechanical system. The electro-mechanical system enables computer control of the rotational movement of the wafer during processing. Further, the entire platen assembly is mounted on a 3-axis (X, Y, Z) linear electromechanical positioning device. Plasma sources, similar to one described in U.S. Pat. No. 5,961,772, are located in proximity to the edge surfaces of the wafer. The gaseous output-flow from the plasma source (the flame) is directed to impinge on the edge surfaces by means of gas flow hardware design and electromechanical positioning devices (X, Y and Z wafer motion axes).

Proper selection of the input gases will determine the nature of the processing performed on the wafer. Certain gas mixtures will cause material on the wafer to react with the constituents in the flame such that the reaction by-products are volatile at the operating pressure. In such cases, the process is subtractive and is commonly referred to as etching. Other input gas mixtures will cause flame constituents to react with each other to deposit material onto the wafer. In such cases, the process is additive and is commonly referred to as chemical vapor deposition (CVD).

The dwell time of the reactive gas flow on any one location of the wafer's edge surfaces shall be controlled via the computer controlled, electro-mechanical positioning devices. For shaping the local topography using an etching process, the flame shall be commanded to dwell for longer times on areas where large material removal is desired and dwell shorter times on areas where less material removal is desired. For CVD processes, the flame shall be commanded to dwell longer times where thicker films are desired and shorter times where thinner films are desired.

For both etching and CVD processes, it will be important for the boundary between the processed area and the unprocessed area to be sharply defined. For this purpose, a flow of diluent and/or quenching gas shall be provided. The diluent and/or quenching gas flow is oriented to inhibit the diffusion of reactive gases from affecting areas on the wafer not intended for processing. Further, adjustable exhaust ports will be employed to direct the reactive gas flow away from the areas not intended for processing.

These and other objects and advantages will become more apparent from the following detailed description taken in conjunction with the accompanying drawings wherein:

FIG. 1a illustrates a part cross-sectional view of a wafer having flaking film fragments in a peripheral edge region;

FIG. 1b illustrates the wafer of FIG. 1a after application of a photoresist coating in accordance with a prior art technique to remedy flaking film;

FIG. 1c illustrates the wafer of FIG. 1b after exposure of the photoresist in accordance with the prior art technique;

Referring to FIGS. 1a to 1f, a previously known technique for edge bead removal (E.B.R.) frequently results in topography near the edge of a wafer 10 that is not readably cleanable and that traps particles.

Figure 1D:
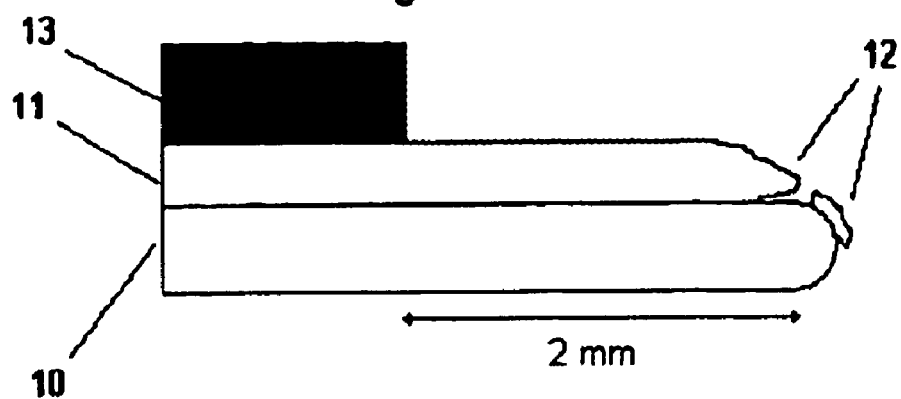
FIG. 1d illustrates the wafer of FIG. 1c after development of the photoresist in accordance with the prior art technique.
Figure 1E:
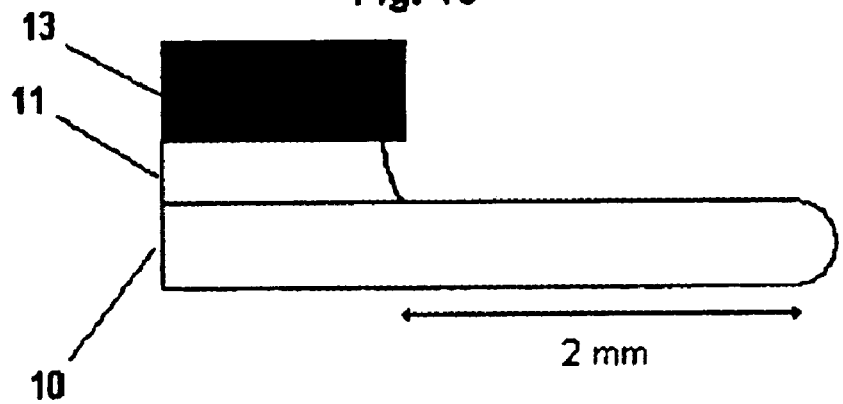
FIG. 1e illustrates the wafer of FIG. 1d after a wet or dry thin film etch in accordance with the prior art technique.
Figure 1F:
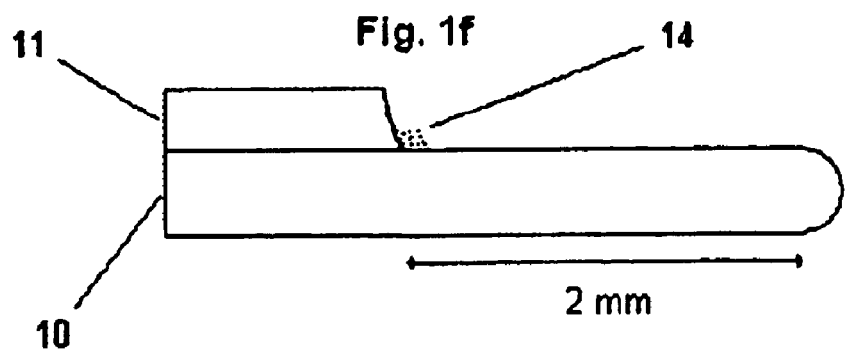
FIG. 1f illustrates the wafer of FIG. 1e after a photoresist strip and cleaning in accordance with the prior art technique.

In accordance with the prior art technique, the wafer 10 is provided with a coating 11 of any suitable material. As indicated, fragments 12 may break away in the form of thin film flakes. Subsequently, as indicated in FIG. 1b, a photoresist coat 13 is applied. After the photoresist coating 13 is exposed using conventional techniques, as indicated in FIG. 1c, and subsequently developed as indicated in FIG. 1d, the coating 11 and flakes 12 at the peripheral edge of the wafer 10 are again uncovered. A wet or dry thin film etch step may then be carried out to remove the coating 11 and flakes 12 at the peripheral edge of the wafer 10, as indicated in FIG. 1e (depicts a wet etch profile). Finally, the photoresist 13 is stripped and the surface is cleaned as indicated in FIG. 1f. However, small particles 14 may become trapped in the region where the coating 11 ends on the wafer 10.

Figure 2A:
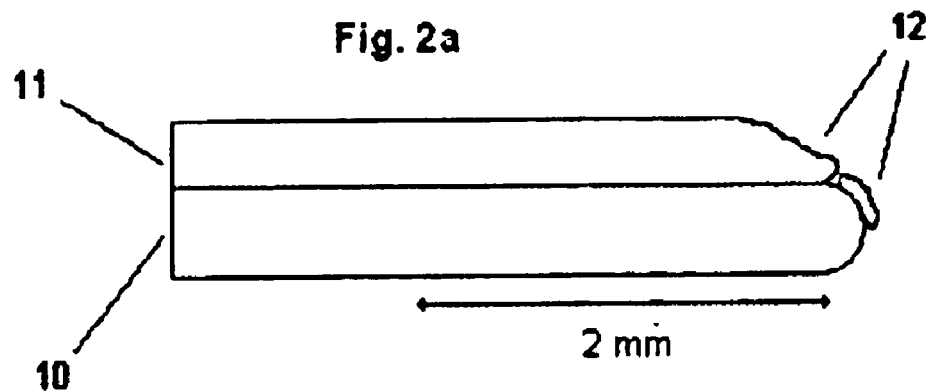
FIG. 2a illustrates a part cross-sectional view of a wafer having flaking film fragments in a peripheral edge region.
Figure 2B:
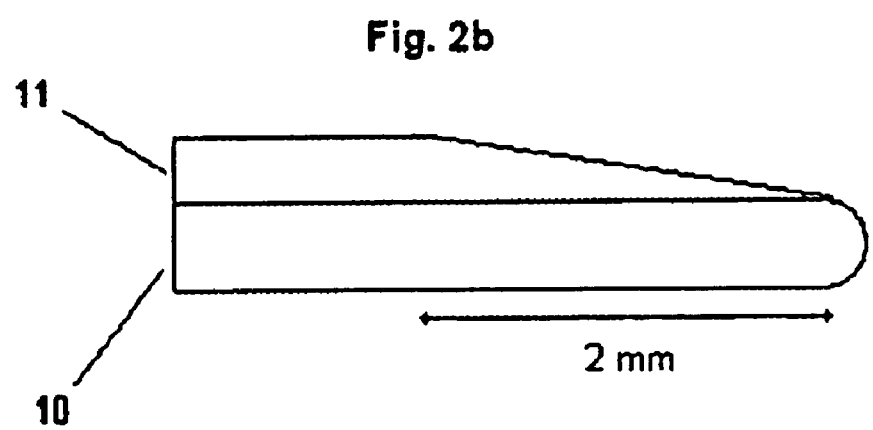
FIG. 2b illustrates a part cross-sectional view of the wafer of FIG. 2a after removal of the flaking film fragments and shaping of the remaining film topography in accordance with the invention.
Figure 2C:
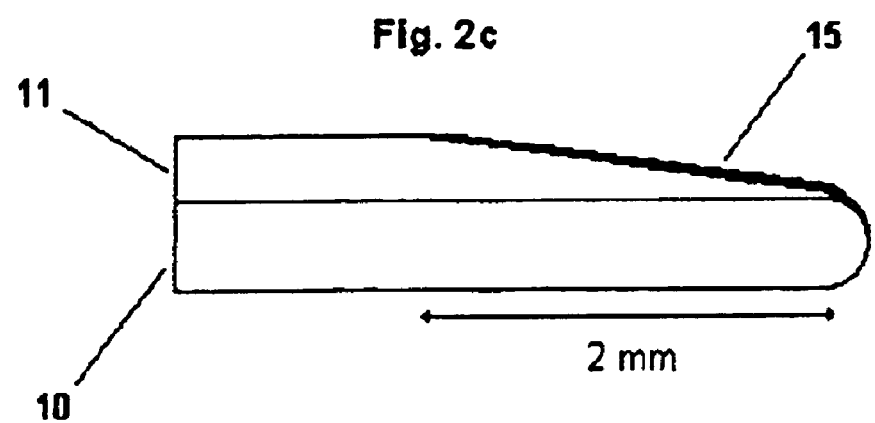
FIG. 2c illustrates the wafer of FIG. 2b after encapsulation of the processed surface in accordance with the invention.

Referring to FIGS. 2a, 2b and 2c, the invention proposes to process a coated wafer as shown in FIG. 2a by removing the flaking film fragments and shaping the remaining film topography in a manner as illustrated. For example as indicated in FIG. 2b, the peripheral edge of the coating 11 is tapered radially outwardly adjacent to the outermost periphery of the wafer 10. Thereafter, as indicated in FIG. 2c, the processed surface of the coating 11 is encapsulated within a layer 15.

Figure 3:
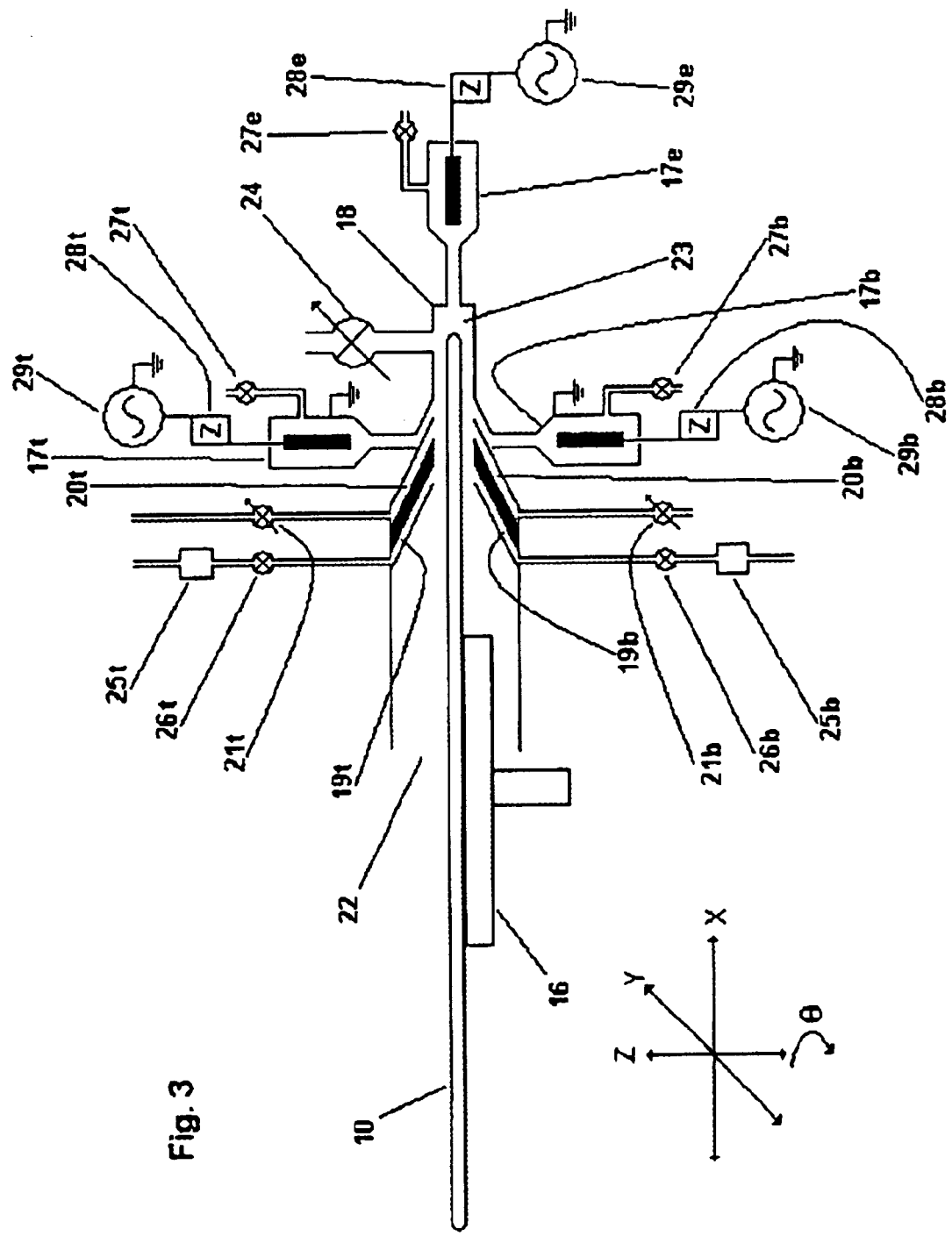
FIG. 3 illustrates a schematic side view of an apparatus for etching of the peripheral edge region of a wafer in accordance with the invention.

Referring to FIG. 3, a wafer 10 is placed on a vacuum chuck 16 that is able to move horizontally in the X and Y axes and also vertically in the Z axis. In addition, the vacuum chuck, 16, is configured with a rotational axis, θ as shown. The vacuum chuck is typically incorporated in an electromechanical system (not shown) having suitable means for moving the vacuum chuck 16 with these 4 degrees of freedom (X, Y, Z, θ).

Referring to FIG. 3, three plasma sources, 17t, 17e and 17b are respectively located in proximity to the top side, the edge and the bottom side of the wafer 10 in order to supply the reactive gas flow toward the three surfaces of the wafer 10. Each plasma source is constructed, such as the atmospheric pressure plasma jet described in U.S. Pat. No. 5,961,772. This arrangement of three plasma sources allows for maximum flexibility in processing options as follows:

Independent processing of the top, bottom or edge surfaces of wafer 10

Simultaneous processing of any two of the above named surfaces of the wafer 10

Simultaneous processing of all three of the above named surfaces of the wafer 10.

Figure 5:
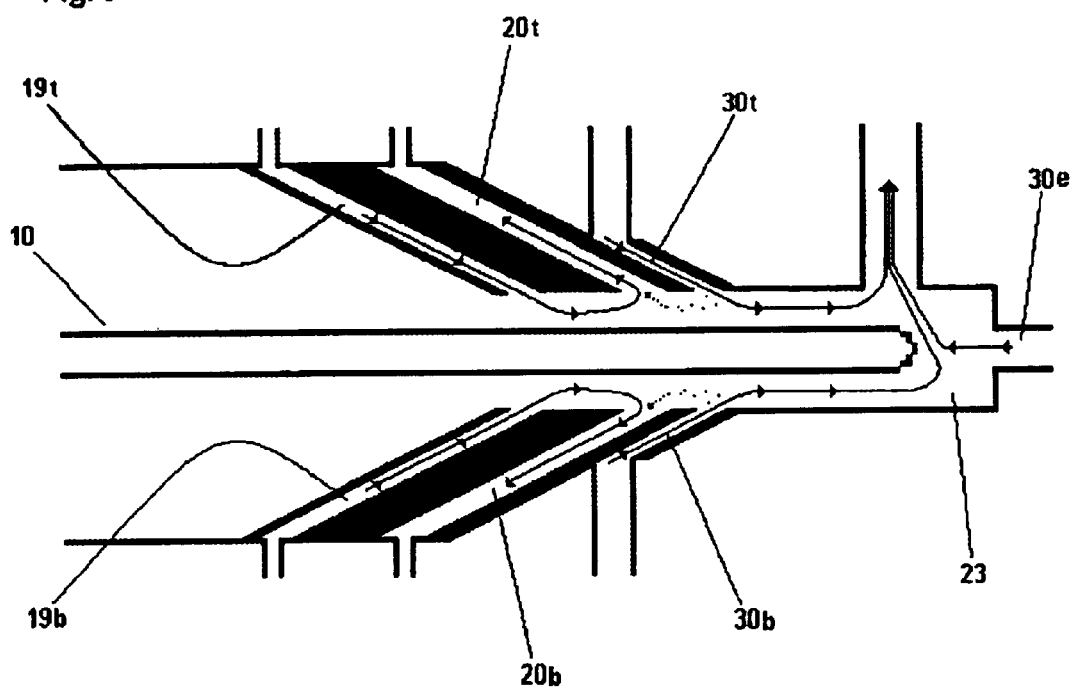
FIG. 5 illustrates an enlarged view of a peripheral edge region of a wafer during etching in accordance with the invention.

Referring to FIGS. 3 and 5, pairs of flow channels 19t, 19b and 20t, 20b associated with their respective plasma sources 17t and 17b provide a means to control the unwanted diffusion of reactive gas flow onto portions of the wafer 10 where processing is unwanted. Channels 19t and 19b supply a diluent or quenching gas flow inward toward the wafer, 10, and directed radially outwards towards the edge of wafer 10. Fine exhaust channels 20t and 20b provide an exhaust flow directed outward from the plane of the wafer 10. Conductance adjustment valves, 21t and 21b are tuned to match the diluent or quenching gas flow rate of the channels 19t and 19b respectively. Reactive gases from plasma sources 17t, 17e and 17b that diffuse towards the center of the wafer are neutralized, entrained in the exhaust flow and removed via fine exhaust channels 20t and 20b. This technique provides for the sharp boundary between the processed and unprocessed regions.

Figure 4:
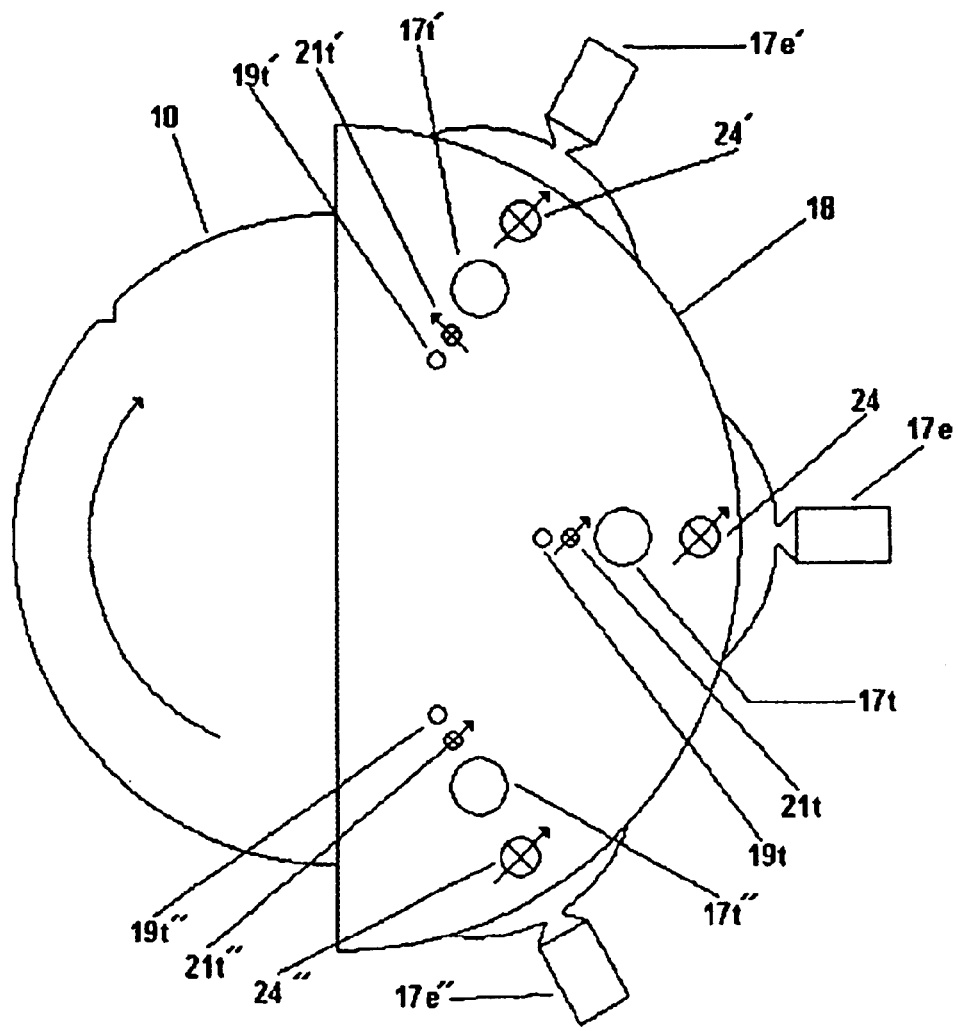
FIG. 4 illustrates a plan view of the apparatus of FIG. 3.

Referring to FIGS. 3 and 4, the plasma sources, 17t, 17t' and 17t" are mounted to a semi-circular housing, 18. The housing includes a slot 22 for receiving the wafer 10 as indicated in FIG. 3, the housing 18 is equal to or approximately equal to one-half the size of the wafer 10. The housing also includes an exhaust plenum, 23, which is connected to the exhaust source (not shown) via an adjustable conductance control valve 24.

As illustrated in three sets of plasma sources, 17 (including 17t, 17e, and 17b), 17' (including 17t', 17e', and 17b') and 17" (including 17t", 17e" and 17b"), quenching gas lines, 19 (including 19t and 19b), 19' (including 19t' and 19b') and 19" (including 19t" and 19b") and exhaust conductance control valves 21 (including 21t and 21b), 21' (including 21t' and 21b') 21" (including 21t" and 21b") and 24, 24' and 24" may be arranged around the housing, 18, as shown. In this arrangement each set can operate independently with respect to process chemistry. For example, one set can perform etching of polymers, as indicated by 17t', 17e', 17b', 19t', 19b', 21t', 21b' and 24', while another set performs etching of $SiO_2$, as indicated by items, 17t, 17e, 17b, 19t, 19b, 21t, 21b and 24, while a third set, as indicated by items 17t", 17e", 17b", 19t", 19b, 21t", 21b" and 24" deposits an encapsulating $SiO_2$ layer.

Examples of processes are shown in Table 1. The first column contains the input gases. The second column contains the active output species. The third column contains the type of process performed and the fourth column contains the thin film addressed by the process.

TABLE 1

| Input Gases | Active output species | Process Type | Thin Film |
|---|---|---|---|
| He, $CF_4$, $O_2$ | Atomic Fluorine | Etch | Si, $SiO_2$, $Si_3N_4$, W, Ta |
| He, $O_2$ | Atomic Oxygen | Etch | Organic Polymers |
| He, $O_3$, TEOS | (O—Si—O) | CVD | $SiO_2$ |

A typical sequence of events to shape an $SiO_2$ thin film on the top surface of a wafer followed by an $SiO_2$ CVD encapsulation process as depicted in FIGS. 2a, 2b and 2c is described below with reference to FIGS. 3 and 5:

1. A well-centered wafer, 10, is placed on the vacuum wafer platen, 16.

2. The vacuum wafer platen is moved in X, Y and Z axes such that the wafer is centered within the slot, 22, and the edge portion of the wafer is located immediately adjacent to diluent/quenching gas supply channels 19t and 19b.

3. Diluent/quenching gas flow rate setpoints are sent to the mass flow controllers (MFC) 25t and 25b and the diluent/quenching gas shutoff valves 26t and 26b are commanded to open. Gas begins to flow down diluent/quenching gas supply channels 19t and 19b and impinges on the edge of the wafer 10.

4. Fine exhaust channel conductance control valve, 21t, is commanded open to a predefined position. (Conductance control valve 21b is not opened. This allows the diluent/quenching gas flow from channel 19b to protect the backside of the wafer 10 from unwanted diffusion of reactive gases).

5. Process gas flow rate setpoints are sent to the process input gas MFCs (not shown) and process input gas shutoff valve 27t is commanded to open. Process input gases He, $O_2$ and $CF_4$ begin to flow through channel 30t.

6. The conductance control valve 24 of housing exhaust plenum 23 is commanded to a pre-defined position.

7. A forward power setpoint is sent to the RF power supply 29t and the RF power is commanded on. A plasma is formed inside the plasma source 17t and reactive gases begin to flow through channel 30t into the housing exhaust plenum 23 and out through the conductance control valve 24 to the exhaust system (not shown).

8. The impedance matching network, 28t, tunes the load impedance to match the output impedance of the RF power supply 29t. The control system (not shown) compares the magnitude of the power reflected back to power supply 29t to a pre-defined threshold value. The control system (not shown) decides to halt the process or continue based upon the reflected power comparison. A successful comparison signifies formation of a stable plasma inside plasma source 17t.

9. Assuming the decision is to continue, the vacuum wafer platen 16 is commanded to begin rotating at a predefined angular velocity.

10. The vacuum wafer platen 16 is commanded to move in the X, Y and Z axes, positioning the edge surfaces into the reactive gas stream flowing from reactive gas channel 30t.

11. The shaping of the thin films is controlled by the dynamics of the vacuum wafer platen's, 16, motion as follows:

12. Referring to FIGS. 2, 3 and 5, from the starting position the wafer 10 is moved in the positive X direction in a smoothly accelerating motion. As the edge of the wafer moves beneath reactive gas channel 30t the $SiO_2$ thin film fragment begins to react with the atomic fluorine in the reactive gas flow to produce a volatile by-product according to the following chemical equation:

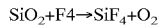

$SiO_2 + F4 \rightarrow SiF_4 + O_2$

As the process effluent, $SiF_4 + O_2$ is produced, the exhaust plenum 23 directs the effluent flow towards the exhaust system (not shown) under control of the conductance control valve 24. Continued movement of the wafer in the positive X axis brings the main portion of the thin film 11 into contact with the reactive gas flowing through channel 30t and the above chemical reaction proceeds to remove a portion of thin film 11. When the preprogrammed edge exclusion limit is reached the vacuum wafer platen 16 is commanded to reverse direction and move in a smoothly decelerating motion until it arrives back at its starting position. The described motion will yield an $SiO_2$ removal profile that, when applied to the thin film shape 11 and 12 depicted in FIG. 2a, will result in the thin film shape 11 depicted in FIG. 2b.

13. Once the thin film removal shaping is complete the RF power supply 29t is commanded off.

14. The process input gas shutoff valve 27t is closed.

15. The diluent/quenching gas shutoff valves 26t and 26b are closed.

16. The diluent/quenching gas supply channel conductance control valve 21t is closed.

17. The housing exhaust plenum's conductance control valve 24 is closed.

Figure 6:
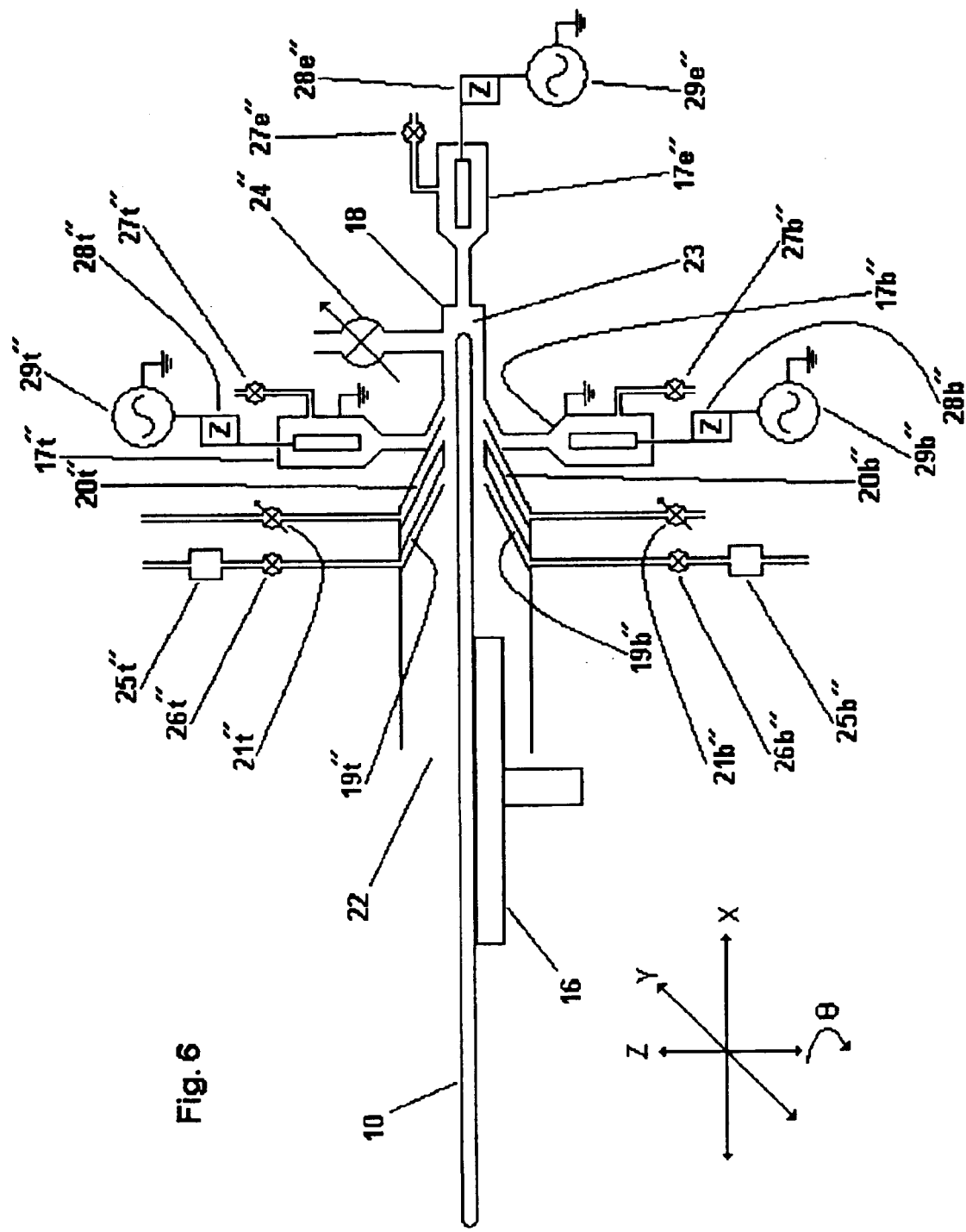
FIG. 6 illustrates a schematic side view of an apparatus for thin film deposition onto the peripheral edge region of a wafer in accordance with the invention.
Figure 7:
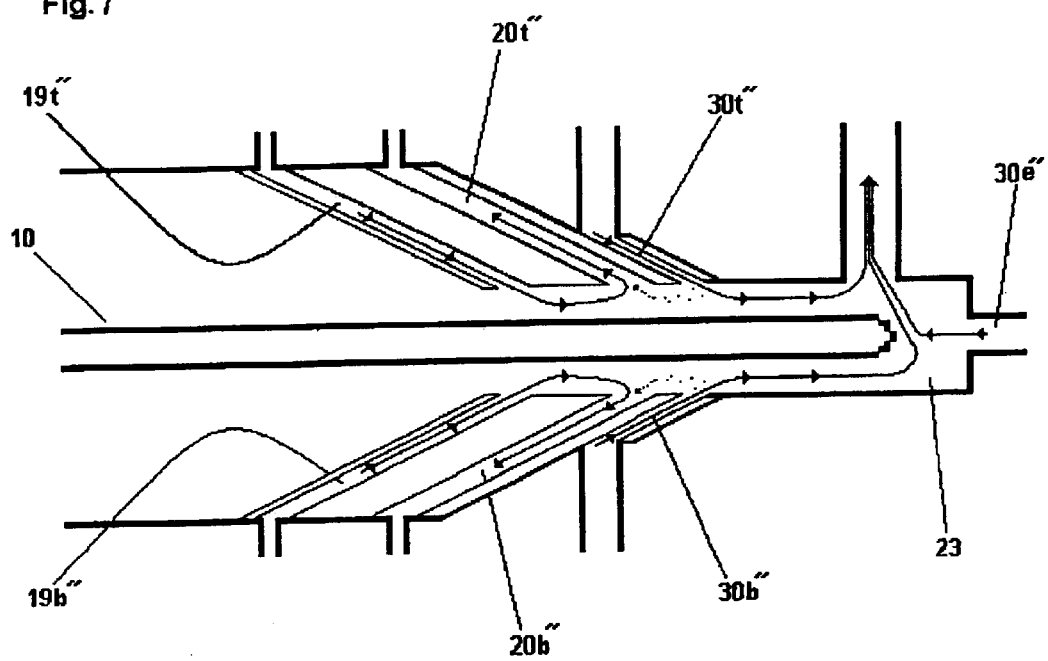
FIG. 7 illustrates an enlarged view of a peripheral edge region of a wafer during thin film deposition in accordance with the invention.

Depending on the application, certain metal films may have become exposed during the oxide removal step. To prevent these metal films from flaking, an encapsulating $SiO_2$ thin film 15 can be deposited as follows:

18. Referring to FIGS. 6 and 7, diluent/quenching gas flow rate setpoints are sent to the mass flow controllers (MFC) 25t" and 25b" and the diluent/quenching gas shutoff valves 26t" and 26b" are commanded to open. Gas begins to flow down diluent/quenching gas supply channels 19t" and 19b" and impinges on the edge of the water 10.

19. Fine exhaust channel conductance control valve 21t" is commanded open to a predefined position. (Conductance control valve 21b" is not opened. This allows the diluent/quenching gas flow from channel 19b" to protect the backside of the wafer 10 from unwanted diffusion of reactive gases).

20. Process gas flow rate setpoints are sent to the process input gas MFCs (not shown) and process input gas shutoff valve 27t" is commanded to open. Process input gases He, TEOS and $O_3$ begin to flow through channel 30t".

21. The conductance control valve 24" of the housing exhaust plenum 23 is commanded to a pre-defined position.

22. A forward power setpoint is sent to the RF power supply 29t" and the RF power is commanded on. A plasma is formed inside the plasma source 17t" and reactive gases begin to flow through channel 30t" into the housing exhaust plenum 23 and out through the conductance control valve 24" to the exhaust system (not shown).

23. The impedance matching network 28t" tunes the load impedance to match the output impedance of the RF power supply 29t". The control system (not shown) compares the magnitude of the power reflected back to power supply 29t" to a pre-defined threshold value. The control system (not shown) decides to halt the process or continue based upon the reflected power comparison. A successful comparison signifies formation of a stable plasma inside plasma source 17t".

24. Assuming the decision is to continue, the vacuum wafer platen 16 is commanded to begin rotating at a pre-defined angular velocity.

25. The vacuum wafer platen 16 is commanded to move in the X, Y and Z axes, positioning the edge surfaces into the reactive gas stream flowing from reactive gas channel 30t'''.

26. The shaping of the thin film deposition is controlled by the dynamics of the motion of the vacuum wafer platen 16 as follows:

27. From the starting position the wafer 10 is moved in the X and Y direction such that the net direction vector is pointing in the direction of the plasma source 17t'''. A smoothly accelerating motion is employed. As the edge of the wafer moves beneath reactive gas channel 30t''' the $SiO_2$ thin film begins to deposit on the wafer, 10, surface according to the following chemical equation:

$$Si(OC_2H_5)+8O_3 \rightarrow SiO_2+10H_2O+8CO_2$$

As the process effluent, $10H_2O+8CO_2$, is produced, the exhaust plenum 23 directs the flow towards the exhaust system (not shown) under control of the conductance control valve 24''. Continued movement of the wafer brings more of the previously etched thin film 11 into contact with the reactive gas flow and the above chemical reaction continues depositing the thin film 15. When the pre-programmed edge exclusion limit is reached the vacuum wafer platen 16 is commanded to reverse direction and move in a smoothly decelerating motion until it arrives back at its starting position. The described motion will yield an $SiO_2$ thin film deposition profile that, when applied to the thin film shape 11 depicted in FIG. 2b, will result in the deposited thin film shape 15 depicted in FIG. 2c.

28. Once the thin film deposition shaping is complete the RF power supply 29t''' is commanded off.

29. The process input gas shutoff valve 27t''' is closed.

30. The diluent/quenching gas shutoff valves 26t''' and 26b''' are closed.

31. The diluent/quenching gas supply channel conductance control valve 21t''' is closed.

32. The housing exhaust plenum's conductance control valve 24'' is closed.

33. With the processing sequence complete, the wafer 10 can be removed from the vacuum wafer platen 16.

The shape of the etched surface can be nearly anything. The limiting factors are the spatial frequency capabilities of the reactive gas footprint shape and the servo system dynamic response. Other shapes of interest might include convex or concave shapes or shapes that intersect the wafer top surface plane further in from the edge.

The protective thin film 15 may be of any suitable thickness. Typically, the film 15 is thin enough such that none of the layer of film 15 extends above the plane of the remaining film 11 and thick enough to be mechanically strong enough to weather the stresses exerted by the film 11 the protective film 15 is covering. For example, a thickness of 0.1 to 0.3 um should be sufficient. The thickness of the layer of film 15 may also be varied in the same way the etching process profile is varied, via a spatial variation of the reactive gas footprint dwell time.

The invention thus provides an apparatus and method of shaping thin films in the regions of in-process semiconductor substrates that are economical and relatively simple and efficient.

The invention also provides a method that allows flakes to be readily removed from a semiconductor substrate and the edge region of the processed substrate to be contoured to a desired shape.

What is claimed is:

1. An apparatus for shaping a thin film on a wafer comprising:

a rotatable chuck for holding a wafer thereon;

a housing having a slot for receiving an edge of a wafer on said rotatable chuck therein;

at least two plasma sources mounted on said housing for generating at least two flows of reactive gas;

a first channel in said housing communicating with a first of the at least two plasma sources to direct the flow of reactive gas toward the edge of the wafer in said slot of said housing;

an exhaust plenum within said housing for receiving the reactive gas;

an exhaust line communicating with and extending from said exhaust plenum for expelling reactive gas from said exhaust plenum;

at least one second channel in said housing located radially within said first channel for directing a flow of diluent/quenching gas onto the wafer; and at least one exhaust channel in said housing located between said second channel and said first channel for exhausting the diluent/quenching gas and reactive gas therefrom.

2. An apparatus as set forth in claim 1 wherein said housing is of semi-circular shape to receive a major portion of the wafer on said chuck in said slot thereof.

3. An apparatus for shaping a thin film on a wafer comprising:

a rotatable chuck for holding a wafer thereon;

a housing having a slot for receiving an edge of a wafer on said rotatable chuck therein;

a plurality of plasma sources mounted on said housing for selectively generating and directing a flow of reactive gas towards and radially outwardly of the edge of the wafer in said slot of said housing, wherein said plurality of plasma sources comprise at least three plasma sources spaced circumferentially of said housing for selectively etching of a polymer on a wafer, etching of silicon dioxide on a wafer and depositing an encapsulating silicon dioxide layer on a wafer in said housing;

a plurality of channels in said housing for directing a flow of diluent/quenching gas onto the wafer in a direction towards the flow of reactive gas; and a plurality of exhaust channels in said housing between said plurality of channels and said plurality of plasma sources for exhausting the diluent/quenching gas and reactive gas therefrom.

4. An apparatus as set forth in claim 3 wherein said housing is of semi-circular shape to receive a major portion of the wafer on said rotatable chuck in said slot thereof.

5. An apparatus as set forth in claim 3 further comprising an exhaust plenum within said housing for receiving the reactive gas and an exhaust line communicating with and extending from said exhaust plenum for expelling reactive gas from said exhaust plenum.

6. An apparatus for shaping a wafer, the apparatus comprising:

a wafer retainer;

a positioning device attached to the wafer retainer operably moving the wafer retainer in at least two directions;

a housing located adjacent at least a portion of the wafer retainer; and a plurality of atmospheric plasma sources connected to the housing; and at least two active output species generated from the plurality of atmospheric plasma sources.

7. The apparatus of claim 6 wherein the at least two active output species comprise atomic fluorine and atomic oxygen.

8. The apparatus of claim 6 wherein the at least two active output species comprise atomic fluorine, atomic oxygen, and O—Si—O.

9. The apparatus of claim 6 wherein at least two of the plurality of atmospheric plasma sources are spaced circumferentially in the housing.

10. The apparatus of claim 6 further comprising: a plurality of channels disposed in the housing for directing a flow of diluent/quenching gas in a direction towards the flow of the at least two active output species.

11. The apparatus of claim 6 further comprising:
a plurality of diluent/quenching gas sources in communication with a plurality of channels disposed in the housing for directing a flow of diluent/quenching gas in a direction towards the flow of the at least two active output species.

12. A substrate shaping apparatus, comprising:
a rotatable substrate retainer device;
a housing at least partially surrounding at least a portion of the rotatable substrate retainer device wherein the housing has an interior and an exterior wherein the interior of the housing comprises a top, a bottom, and an end;
a first plasma channel disposed in the top of the housing defining an angularly offset passageway angled towards the end of the housing;
a first atmospheric plasma source disposed on the exterior of the housing for directing a flow of reactive gas in the interior of the housing wherein the first atmospheric plasma source is in communication with the first plasma channel;
a second plasma channel disposed in the bottom of the housing defining an angularly offset passageway angled towards the end of the housing; and
a second atmospheric plasma source disposed on the exterior of the housing for directing a flow of reactive gas in the interior of the housing wherein the second atmospheric plasma source is in communication with the second plasma channel.

13. The apparatus of claim 12 further comprising:
a first diluent/quenching gas channel disposed in the top of the housing for directing a flow of diluent/quenching gas in the interior of the housing;
a second diluent/quenching gas channel disposed in the bottom of the housing for directing a flow of diluent/quenching gas in the interior of the housing;
a first exhaust channel disposed in the top of the housing for exhausting the diluent/quenching gas and the reactive gas from the interior of the housing wherein the first exhaust channel is between the first diluent/quenching gas channel and the first plasma channel; and
a second exhaust channel disposed in the bottom of the housing for exhausting the diluent/quenching gas and the reactive gas from the interior of the housing wherein the second exhaust channel is between the second diluent/quenching gas channel and the second plasma channel.

14. The apparatus of claim 12 further comprising:
a third plasma channel disposed in the end of the housing.

* * * * *

UNITED STATES PATENT AND TRADEMARK OFFICE
CERTIFICATE OF CORRECTION

PATENT NO.    : 6,936,546 B2
DATED         : August 30, 2005
INVENTOR(S)   : Michael D. Robbins It is certified that error appears in the above-identified patent and that said Letters Patent is hereby corrected as shown below:

Column 7,
Line 14, "$10H_2$" should be -- $10H_2O$ --.
Line 53, "0.3um" should be -- $0.3\,\mu m$ --.

Signed and Sealed this

Thirty-first Day of January, 2006

JON W. DUDAS
*Director of the United States Patent and Trademark Office*